United States Patent [19]
Dalmia

[11] Patent Number: 6,075,388
[45] Date of Patent: Jun. 13, 2000

[54] PHASE DETECTOR WITH EXTENDED LINEAR RANGE

[75] Inventor: Kamal Dalmia, Austin, Tex.

[73] Assignee: Cypress Semiconductor Corp.

[21] Appl. No.: 09/302,213

[22] Filed: Apr. 29, 1999

Related U.S. Application Data

[60] Provisional application No. 60/104,486, Oct. 16, 1998.
[51] Int. Cl.[7] ............................ G01R 25/00; H03D 13/00
[52] U.S. Cl. .................................................................. 327/12
[58] Field of Search ................................... 327/2, 3, 5, 7, 327/8, 10, 12, 41, 43, 44, 150, 159, 236–238, 254, 225; 331/25; 375/375

[56] References Cited

U.S. PATENT DOCUMENTS

| | | | |
|---|---|---|---|
| 4,535,459 | 8/1985 | Hogge, Jr. .................................. | 375/80 |
| 5,138,281 | 8/1992 | Boudewijns ............................. | 331/1 A |
| 5,384,551 | 1/1995 | Kennedy et al. .......................... | 331/17 |
| 5,436,938 | 7/1995 | Pigeon ...................................... | 375/376 |
| 5,539,345 | 7/1996 | Hawkins .................................. | 327/150 |
| 5,712,580 | 1/1998 | Baumgartner et al. .................... | 327/12 |
| 5,754,080 | 5/1998 | Chen et al. ................................ | 331/25 |
| 5,926,041 | 7/1999 | Duffy et al. ............................... | 327/12 |

OTHER PUBLICATIONS

A 0.8–μm CMOS 2.5 Gb/s Oversampling Receiver and Transmitter for Serial Links, By: Chih–Kong Ken Yang and Mark A. Horowitz, IEEE Journal of Solid–State Circuits, vol. 31, No. 12, Dec. 1996, pp. 2015–2023.

FP 15.3: A 1.25Gb/s, 460mW CMOS Transceiver for Serial Data Communication, By: Dao–Long Chen, Michael O. Baker, 1997 IEEE International Solid–State Circuits Conference, pp. 242–243.

FP 15.1: A 1.0625 Gbps Transceiver with 2x–Oversampling and Transmit Signal Pre–Emphasis, By: Alan Fiedler, Ross Mactaggart, James Welch, Shoba Krishnan, 1997 IEEE International Solid–State Circuits Conference, pp. 238–239.

Mohammad Navabi et al., U.S.S.N. 08/878,714, Phase Locked Loop (PLL) With Linear Parallel Sampling Phase Detector, filed Jun. 19, 1997.

Mohammad Navabi et al., U.S.S.N. 08/879,287, Phase Detector With Linear Output Response, Filed Jun. 19, 1997.

Kamal Dalmia, U.S.S.N. 09/302,214, Clock An Data Recovery PLL Based on Parallel Architecture, filed Apr. 29, 1999.

Kamal Dalmia, U.S.S.N. 09/283,058, Method, Architecture and Circuit for Half–Rate Clock and/or Data Recovery, filed Apr. 1, 1999.

Kamal Dalmia et al., U.S.S.N. 09/216,465, Phase Detector, filed Dec. 18, 1998.

*Primary Examiner*—My-Trang Nuton
*Attorney, Agent, or Firm*—Christopher P. Maiorana, P.C.

[57] ABSTRACT

A phase detector circuit comprising a pump-up circuit and a pump-down circuit. The pump-up circuit may be configured to generate a pump-up signal in response to (i) a data signal, (ii) a half-rate clock signal and (iii) a quadrature of the half-rate clock signal. The pump-down circuit may be configured to generate a pump-down signal in response to (i) the pump-up signal and (ii) the quadrature of the half-rate clock signal.

20 Claims, 3 Drawing Sheets

(CONVENTIONAL)

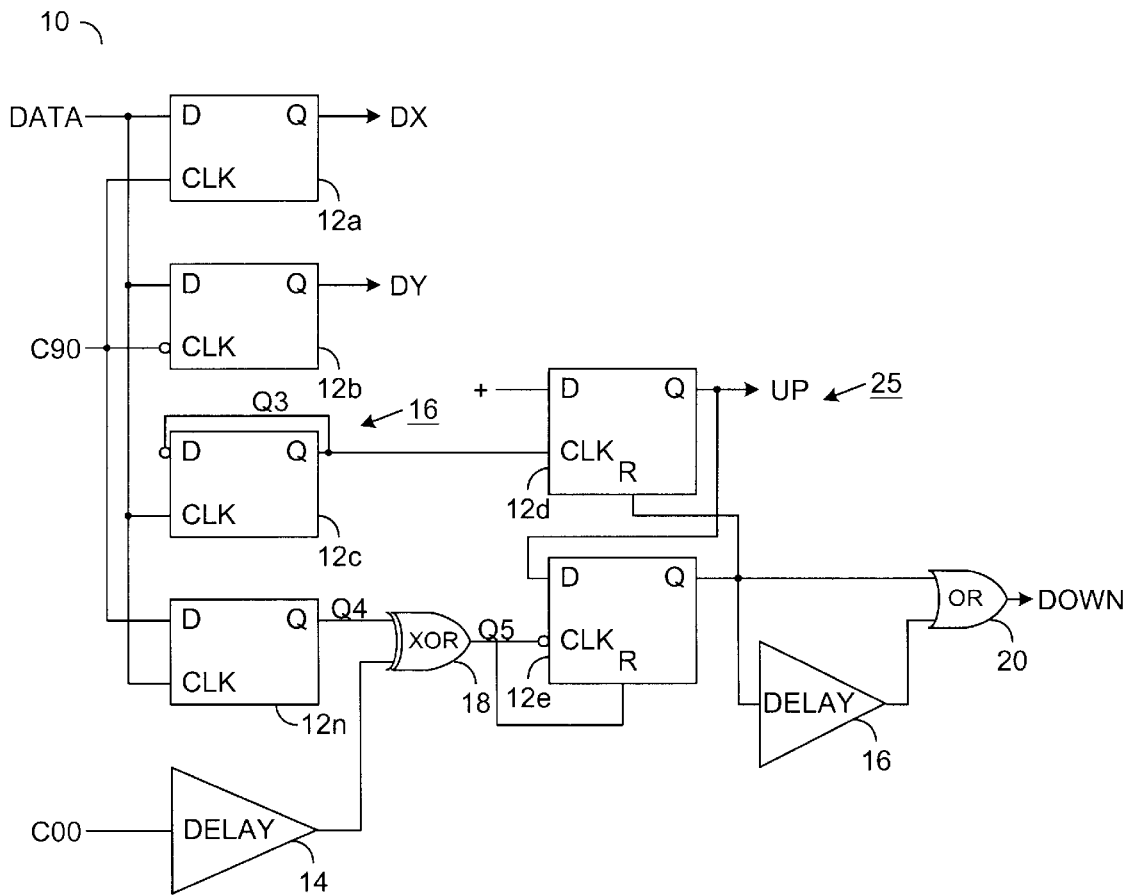
FIG. 1
(CONVENTIONAL)

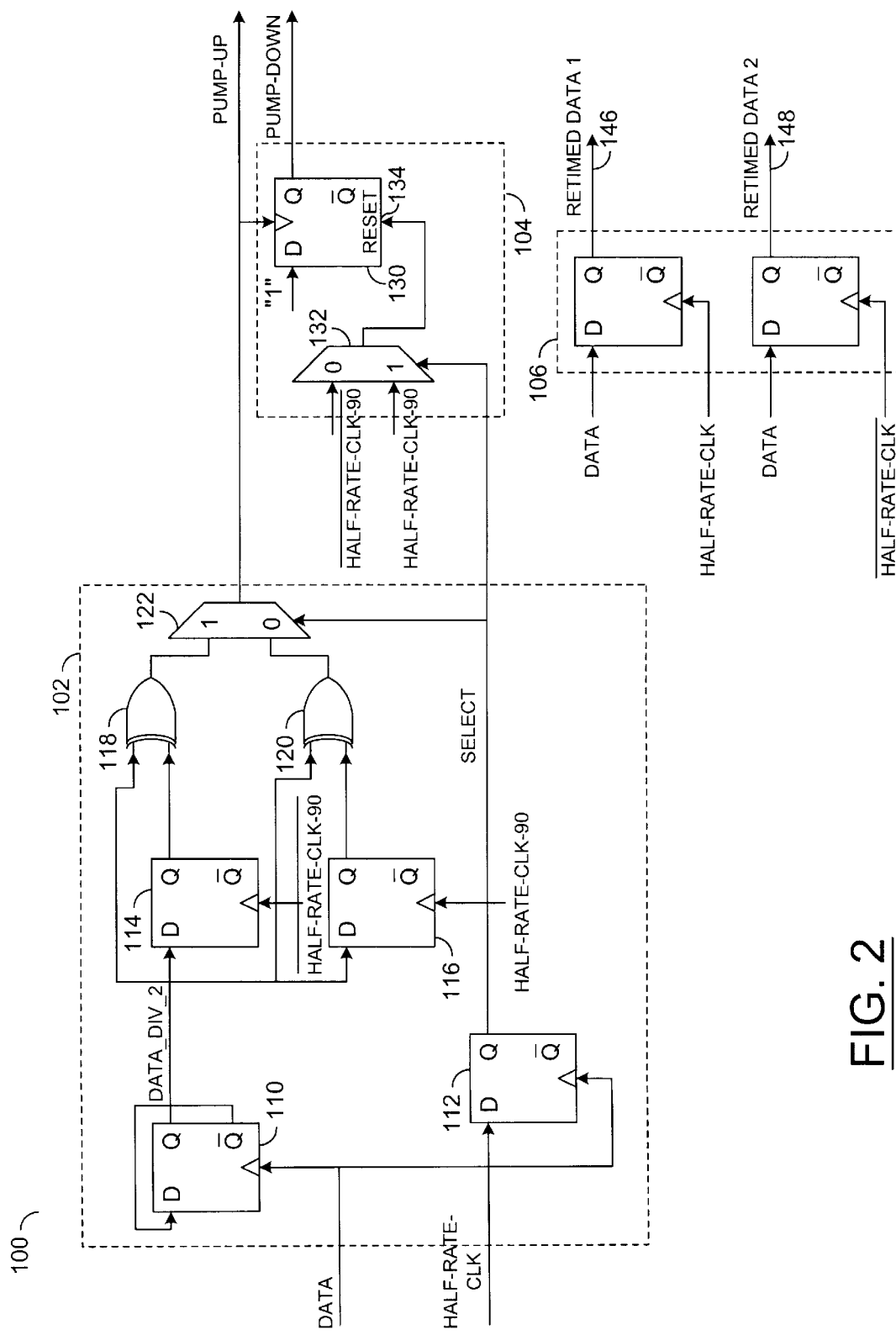
FIG. 2
(CONVENTIONAL)

PHASE DETECTOR WITH EXTENDED LINEAR RANGE

CROSS-REFERENCE TO RELATED APPLICATIONS

The present invention may relate to co-pending applications Ser. No. 60/104,486, filed Oct. 16, 1998, Ser. No. 09/216,465, filed Dec. 18, 1998, Ser. No. 09/283,058, filed Apr. 1, 1999, and Ser. No. 09/302,214, filed Apr. 29, 1999, which are each hereby incorporated by reference in their entirety.

FIELD OF THE INVENTION

The present invention relates to a linear phase detectors generally and, more particularly, to a linear phase detector that may be used in an analog phase-locked loop (PLL) for data and/or clock recovery.

BACKGROUND OF THE INVENTION

Phase detectors are logic circuits used to generate pump-up and pump-down signals to control charge-pump circuits in a clock and data recovery PLL. Phase detectors can also generate recovered-data. As operating speeds of clock and data recovery units increase, the design of voltage-controlled oscillators and charge pump circuits becomes complicated and highly power consuming. Current architectures use full-rate clocks and tend to generate nominally half-bit-wide pump-up and pump-down pulses. This implies that charge-pump must work with narrow pulses. However, it is desirable to have nominally bit-wide pump-up and pump-down pulses. Some architectures use multiple phases of a lower-rate clock but feature non-linear characteristics or reduced linear range.

Referring to FIG. 1, a circuit 10 illustrates a conventional phase detector that may be found in U.S. Pat. No. 5,712,580. The circuit 10 comprises a number of D flip-flops 12a–12n, a delay circuit 14, a delay circuit 16, an XOR gate 18 and a OR gate 20.

The phase detector 10 generates a one and one-half bit wide pump-up and pump-down signal. However, the phase detector 10 works on every other rising (or falling) data edge only. As a result, to generate a set of pump signals for every edge of data, the basic phase detector structure must be replicated four times (twice for each rising edge and twice for each falling edge). The phase detector 10 may require an excessive number of gates due to the replication of the circuit four times to retain information in all data edges. The additional gates imply more power consumption.

SUMMARY OF THE INVENTION

The present invention concerns a phase detector circuit comprising a pump-up circuit and a pump-down circuit. The pump-up circuit may be configured to generate a pump-up signal in response to (i) a data signal, (ii) a half-rate clock signal and (iii) a quadrature of the half-rate clock signal. The pump-down circuit may be configured to generate a pump-down signal in response to (i) the pump-up signal and (ii) the quadrature of the half-rate clock signal.

The objects, features and advantages of the present invention include providing a phase detector that may (i) enable higher data rate linear PLLs in existing integrated-circuit technologies (for a given performance level), (ii) be implemented using half-rate components that may consume less power, (iii) implement a half-rate phase detector that may generate nominally "bit-wide" pump-up and pump-down signals, (iv) implement a half-rate phase-detector with extended linear range compared to "half-bit-wide" pump-up and pump-down generating linear phase detectors, (v) implement a phase detector generating two internal pump-up signals and dynamically selecting one to be the final pump-up signal using clock sampled by data as a reference and/or (vi) generate one pump-down generated from the final pump-up signal.

BRIEF DESCRIPTION OF THE DRAWINGS

These and other objects, features and advantages of the present invention will be apparent from the following detailed description and the appended claims and drawings in which:

FIG. 1 is a block diagram of a conventional phase detector;

FIG. 2 is a block diagram of a preferred embodiment of the present invention.

DETAILED DESCRIPTION OF THE PREFERRED EMBODIMENTS

Figure 3:
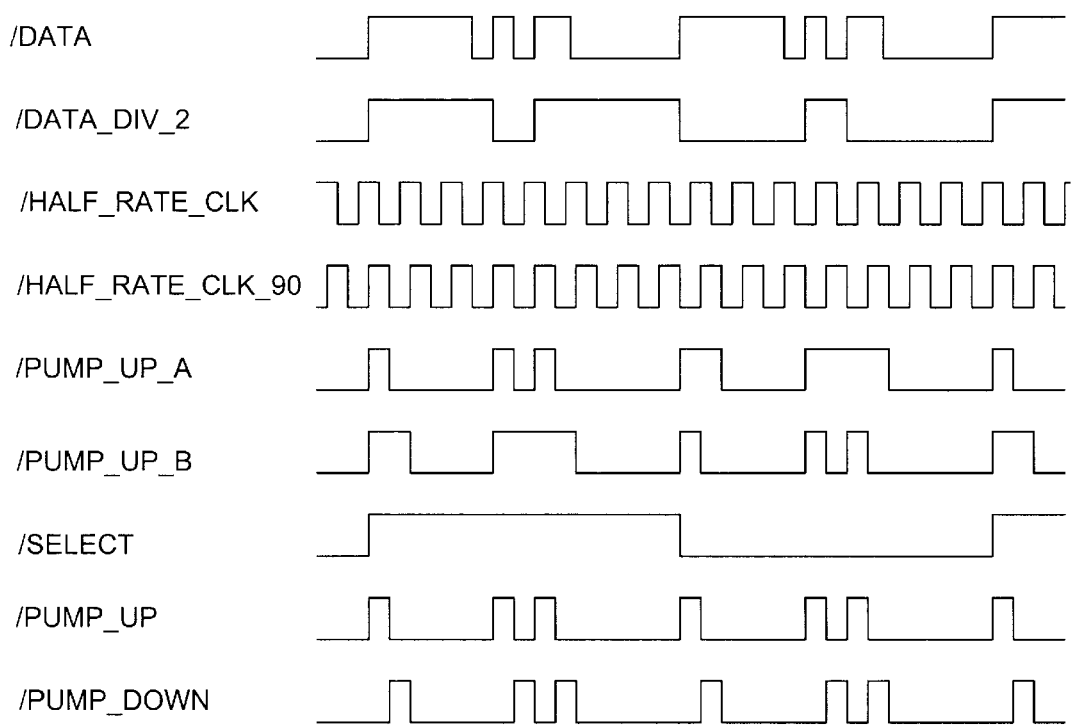
FIG. 3 is a timing diagram of various waveforms of the circuit of FIG. 2.

Referring to FIG. 2, a block diagram of a circuit 100 is shown in accordance with a preferred embodiment of the present invention. The circuit 100 generally comprises a pump-up section 102, a pump-down section 104 and a data recovery section 106. The pump-up section 102 generally comprises a flip-flop 110, a flip-flop 112, a flip-flop 114, a flip-flop 116, a gate 118, a gate 120 and a multiplexer 122. The flip-flops 110, 112, 114 and 116 may be implemented, in one example, as D-type flip-flops. Alternatively, the flip-flops 110, 112, 114 and 116 may be implemented as T-type flip-flops. The flip-flop 110 and the flip-flop 112 generally receive a data input signal (e.g., DATA) at respective clock inputs. The flip-flop 110 generally presents a signal (e.g., DATA_DIV_2) at a Q output. A Qb output (e.g., a digital complement of the Q output) is generally presented to the D input of the flip-flop 110. The signal DATA_DIV_2 is generally presented to a D input of the flip-flop 114, a first input of the gate 118, a first input of the gate 120 and the input of the gate 116. In one example, the gates 118 and 120 may be implemented as XOR gates. However, other gates may be implemented accordingly to meet the design criteria of a particular implementation.

The flip-flop 116 generally receives a quadrature (e.g., HALF-RATE_CLK-90) of the signal presented to the flip-flop 112. A quadrature signal is generally referred to as a signal that is phase shifted 90°. The flip-flop 114 generally receives a digital complement of the signal presented to the clock input of the flip-flop 116 (e.g., HALF-RATE_CLK-90). The flip-flop 114 has an output that generally presents a signal to a second input of the gate 118. Similarly, the flip-flop 116 has an output that is generally presented to a second input of the gate 120. The gate 118 generally presents a signal (e.g., an internal pump-up signal PUMP_UP_A) to a first input of the multiplexer 122. The gate 120 generally presents a signal (e.g., an internal pump-up signal PUMP_UP_B) to a second input of the multiplexer 122. The flip-flop 112 generally presents a signal (e.g., SELECT) to a control input of the multiplexer 122. The signal SELECT is generally a gated (or sampled) version of the signal HALF-RATE_CLK.

The pump-down circuit 104 generally comprises a flip-flop 130 and a multiplexer 132. The flip-flop 130 may be, in one example, a D-type flip-flop with a reset input. The multiplexer 132 generally receives the signal SELECT at a control input, the signal HALF-RATE_CLK-90 at a first input and the signal HALF-RATE_CLK-90 at a second input. The multiplexer 132 generally presents a signal to an input 134 of the flip-flop 130. The input 134 may be a reset input. The flip-flop 130 generally receives a digital high or a "1" at an input. The clock input of the flip-flop 130 generally receives the signal PUMP-UP. The output of the flip-flop 130 generally presents a signal (e.g., PUMP-DOWN).

The recovery section 106 generally comprises a flip-flop 142 and a flip-flop 144. The flip-flop 142 generally receives the signal HALF-RATE_CLK at a clock input, the signal DATA at a data input and may present a retimed data signal at an output 146. The flip-flop 144 generally receives the signal HALF-RATE_CLKb at a clock input, the signal DATA at a D input and may present a retimed data signal at an output 148.

In general, the circuit 100 provides a 2× parallel sampling phase-detector that generally responds to the signal HALF-RATE_CLK and HALF-RATE_CLK-90. The flip-flop 110 may act as a data divider to generate the signal DATA_DIV_2, which generally has edges that respond to one edge (e.g., the rising edge) of the signal DATA. The signal DATA_DIV_2 may be used to generate the signals PUMP_UP_A or PUMP_UP_B for each edge. The flip-flop 114 and the XOR gate 118 may be used to generate the signal PUMP_UP_A. The flip-flop 116 and the XOR gate 120 may be used to generate the signal PUMP_UP_B. Depending on the polarity of the signal DATA and the signal HALF-RATE_CLK, one of the internal pump signals PUMP_UP_A or PUMP_UP_B may be selected by the multiplexer 122 as the final signal PUMP_UP.

The generation of the signal PUMP_UP and selection may be implemented, in one example, by the following method: (i) generate a positive transition for each edge of the signal DATA_DIV_2, (ii) generate the internal pump-up signal PUMP_UP_A using the signal HALF-RATE_CLK-90 and the internal pump-up signal PUMP_UP_B in response to the signal HALF-RATE_CLK-90b, (iii) sample the signal HALF-RATE_CLK with the signal DATA, (iv) if the signal HALF-RATE_CLK is sampled HIGH by the flip-flop 112, use the multiplexer 122 to select the internal pump-up signal PUMP_UP_A (e.g., the signal generated by the flip-flop 114 and the gate 118), and (v) if the signal HALF-RATE_CLK is sampled LOW by the flip-flop 112, use the multiplexer 122 to select the internal pump-up signal PUMP UP B (e.g., the signal generated by the flip-flop 116 and the gate 120).

The signal PUMP-DOWN may be generated, in one example, by the following method: (i) if the signal HALF-RATE_CLK is sampled HIGH by the flip-flop 112, use the multiplexer 132 to select HALF-RATE_CLK-90 to generate the signal PUMP-DOWN, (ii) if the signal HALF-RATE_CLK is sampled LOW by the flip-flop 112, use the multiplexer 132 to select the signal HALF-RATE-CLK-90b to generate the signal PUMP-DOWN, (iii) start the signal PUMP-DOWN on the one edge (e.g., the falling edge) of the signal PUMP-UP using the flip-flop 130, and (iv) stop the signal PUMP-DOWN in response to the signal HALF-RATE_CLK-90 or the signal HALF-RATE_CLK-90b selected in step (i) or (ii).

The signal RETIMED DATA may be generated using the flip-flop 142 and the flip-flop 144. Two data streams may be generated, one on each edge of the signal HALF-RATE_CLK. In general, the phase detector 100 responds to only one edge transition of the signal DATA. However, in design applications requiring phase detection using both edges, the circuit 100 may be replicated such that there are two phase detectors may respond to the rising and falling edges of data, respectively.

Referring to FIG. 3, a timing diagram illustrating the various waveforms, and an example of the respective transitions of the waveforms is shown.

While the invention has been particularly shown and described with reference to the preferred embodiments thereof, it will be understood by those skilled in the art that various changes in form and details may be made without departing from the spirit and scope of the invention.

I claim:

1. A phase detector circuit comprising:
    a pump-up circuit configured to generate a pump-up signal in response to (i) a data signal, (ii) a half-rate clock signal and (iii) a quadrature of said half-rate clock signal; and
    a pump-down circuit configured to generate a pump-down signal in response to (i) said pump-up signal and (ii) a direct connection of said quadrature of said half-rate clock signal.

2. The circuit according to claim 1, wherein said pump-up signal and said pump-down signal are bit-wide signals.

3. The circuit according to claim 1 further comprising:
    a data recovery circuit comprising a first circuit configured to generate a first retimed data signal in response to (i) said data signal and (ii) said half-rate clock signal.

4. The circuit according to claim 3, wherein said data recovery circuit further comprises:
    a second circuit configured to generate a second retimed data signal in response to a digital complement of said half-rate clock signal, wherein said second retimed data signal operates on a positive transition of said half-rate clock and said first retimed data signal operates on a negative transition of said half-rate clock signal.

5. The circuit according to claim 1, wherein said pump-up circuit further comprises:
    a first memory device configured to generate a first internal pump-up signal;
    a second memory device configured to generate a second internal pump-up signal; and
    a selection device configured to select said pump-up signal in response to (i) said first internal pump-up signal, (ii) said second internal pump-up signal and (iii) said half-rate clock signal.

6. The circuit according to claim 5, wherein said selection device selects said first or said second internal pump-up signal as said pump-up signal in response to a gated version of said half-rate clock signal.

7. The circuit according to claim 5, wherein:
    said first internal clock signal is generated in further response to a first gate circuit; and
    said second internal clock signal is generated in further response to a second gate circuit.

8. The circuit according to claim 5, wherein said pump-up signal is selected in response to the polarity of the data signal and the half-rate clock signal.

9. The circuit according to claim 1, wherein said pump-down circuit further comprises:
    a memory circuit configured to generate said pump-down signal in response to a control signal; and
    a selection circuit configured to present said control signal in response to (i) said quadrature of said half-rate clock signal and (ii) a digital complement of said half-rate clock signal.

10. A phase detector circuit comprising:
   means for generating a pump-up signal in response to (i) a data signal, (ii) a half-rate clock signal and (iii) a quadrature of said half-rate clock signal; and
   means for generating a pump-down signal in response to (i) said pump-up signal and (ii) a direct connection said quadrature of said half-rate clock signal.

11. A method for controlling a phase detector comprising the steps of:
   (A) generating a pump-up signal in response to (i) a data signal, (ii) a half-rate clock signal and (iii) a quadrature of said half-rate clock signal; and
   (B) generating a pump-down signal in response to (i) said pump-up signal and (ii) a direct connection of said quadrature of said half-rate clock signal.

12. The method according to claim 11 further comprising the step of:
   (C) generating a first retimed data signal in response to (i) said data signal and (ii) said half-rate clock signal.

13. The method according to claim 12, wherein step (C) further comprises:
   generating a second retimed data signal in response to a digital complement of said half-rate clock signal, wherein said second retimed data signal operates on a positive transition of said half-rate clock and said first retimed data signal operates on a negative transition of said half-rate clock signal.

14. The method according to claim 11, wherein step (A) further comprises the sub-steps of:
   (A-1) generating a first internal pump-up signal;
   (A-2) generating a second internal pump-up signal; and
   (A-3) selecting either said first internal pump-up signal or said second internal pump-up signal as said pump-up signal in response to said half-rate clock signal.

15. The method according to claim 14, wherein sub-step (A-3) selects said first or said second internal pump-up signal as said pump-up signal in response to a gated version of said half-rate clock signal.

16. The method according to claim 14, wherein sub-step (A-1) comprises gating said first internal clock signal and sub-step (A-2) comprises gating said second internal clock signal.

17. The method according to claim 14, wherein sub-step (A-3) selects said pump-up signal in response to the polarity of the data signal and the half-rate clock signal.

18. The method according to claim 11, wherein said pump-up signal is generated in response to the following sub-steps:
   (A-1) generating a positive transition for each edge of a divided data signal;
   (A-2) generating a first internal pump-up signal in response to the quadrature of the half-rate clock signal;
   (A-3) generating the internal pump-up signal in response to a digital complement of the half-rate clock signal;
   (A-4) sampling the half-rate clock signal with the data signal; and
   (A-5) if the half-rate clock signal is sampled at a first state, selecting the first internal pump-up signal or, if the half-rate rate clock signal is sampled at a second state, selecting the second internal pump-up signal.

19. The method according to claim 18, wherein the pump-down signal is generated in response to the following sub-steps:
   (B-1) if the half-rate clock signal is sampled at said first state, selecting the quadrature of the half-rate clock signal to generate the pump-down signal;
   (B-2) if the half-rate clock signal is sampled at said second state, selecting a digital complement of the half-rate clock signal to generate the pump-down signal;
   (B-3) starting the pump-down signal on the one edge of the pump-down signal; and
   (B-4) stopping the pump-down signal in response to the signal selected in sub-step (B-1) or sub-step (B-2).

20. The method according to claim 19, wherein a first re-timed data signal and a second re-timed data signal are generated on each respective edge of the half-rate clock signal.

* * * * *

UNITED STATES PATENT AND TRADEMARK OFFICE
CERTIFICATE OF CORRECTION

PATENT NO.   : 6,075,388                                              Page 1 of 1
DATED        : June 13, 2000
INVENTOR(S)  : Kamal Dalmia It is certified that error appears in the above-identified patent and that said Letters Patent is hereby corrected as shown below:

Drawings,
Figure 2, should read as follows:

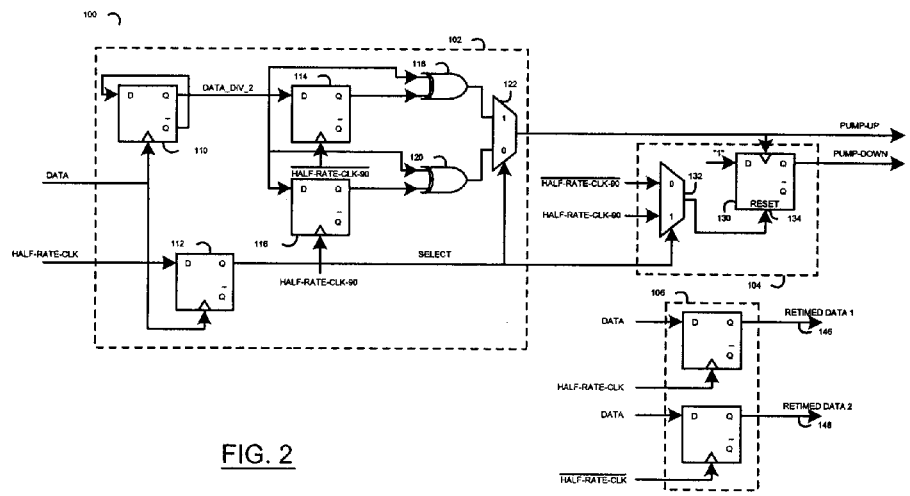

FIG. 2

Signed and Sealed this

Twenty-second Day of October, 2002

*Attest:*

*Attesting Officer*

JAMES E. ROGAN
*Director of the United States Patent and Trademark Office*